United States Patent
Hashimoto

(10) Patent No.: US 10,634,724 B2
(45) Date of Patent: Apr. 28, 2020

(54) CAPACITY MAINTENANCE RATE ESTIMATION APPARATUS OR CAPACITY MAINTENANCE RATE ESTIMATION METHOD

(71) Applicant: Nissan Motor Co., Ltd., Yokohama-shi, Kanagawa (JP)

(72) Inventor: Hiroaki Hashimoto, Kanagawa (JP)

(73) Assignee: Nissan Motor Co., Ltd., Yokohama-shi, Kanagawa (JP)

(*) Notice: Subject to any disclaimer, the term of this patent is extended or adjusted under 35 U.S.C. 154(b) by 0 days.

(21) Appl. No.: 15/776,445

(22) PCT Filed: Nov. 20, 2015

(86) PCT No.: PCT/JP2015/082718
§ 371 (c)(1),
(2) Date: May 16, 2018

(87) PCT Pub. No.: WO2017/085869
PCT Pub. Date: May 26, 2017

(65) Prior Publication Data
US 2018/0335479 A1 Nov. 22, 2018

(51) Int. Cl.
*G01R 31/3842* (2019.01)
*G01R 31/36* (2020.01)
(Continued)

(52) U.S. Cl.
CPC ......... *G01R 31/3648* (2013.01); *G01R 31/36* (2013.01); *G01R 31/388* (2019.01); *G01R 31/3842* (2019.01); *G01R 31/392* (2019.01)

(58) Field of Classification Search
CPC ............ G01R 31/3679; G01R 31/3624; B60L 11/1861
See application file for complete search history.

(56) References Cited

U.S. PATENT DOCUMENTS

2004/0178798 A1* 9/2004 Kikuchi ........... G01R 19/16542
324/426
2007/0096743 A1* 5/2007 Arai ................... G01R 31/3679
324/426
(Continued)

FOREIGN PATENT DOCUMENTS

CN 102077105 A 5/2011
JP 2011215125 A 10/2011
(Continued)

*Primary Examiner* — Mohamed Charioui
*Assistant Examiner* — Christine Y Liao
(74) *Attorney, Agent, or Firm* — Young Basile Hanlon & MacFarlane, P.C.

(57) ABSTRACT

A capacity ratio estimation apparatus and method for a battery detects current and voltage of the battery; specifies an integration period from a first time point to a second time point and calculates an integration value of the current for the integration period based on detected current; calculates a first open circuit voltage at the first time point based on the detected voltage and calculates a second open circuit voltage of the battery at the second time point based on the detected voltage; and estimates a capacity ratio of the battery based on a voltage difference between the first open circuit voltage and the second open circuit voltage and an integration value satisfying predetermined conditions. The integration value is equal to a predetermined lower limit value or greater and an average value of the current of the battery for the integration period is equal to the predetermined value or greater.

8 Claims, 13 Drawing Sheets

(51) Int. Cl.
    *G01R 31/388*    (2019.01)
    *G01R 31/392*    (2019.01)

(56)            References Cited

U.S. PATENT DOCUMENTS

2009/0322283  A1   12/2009  Zhang et al.
2014/0217987  A1    8/2014  Shim et al.
2015/0346285  A1   12/2015  Igarashi et al.
2016/0351976  A1   12/2016  Kawahara et al.

FOREIGN PATENT DOCUMENTS

JP          2013238403  A       11/2013
JP             5393616  B2  *    1/2014  ............. Y02E 60/12
JP          2014153353  A        8/2014
WO          2014132403  A1       9/2014
WO          2015125537  A1       8/2015

* cited by examiner

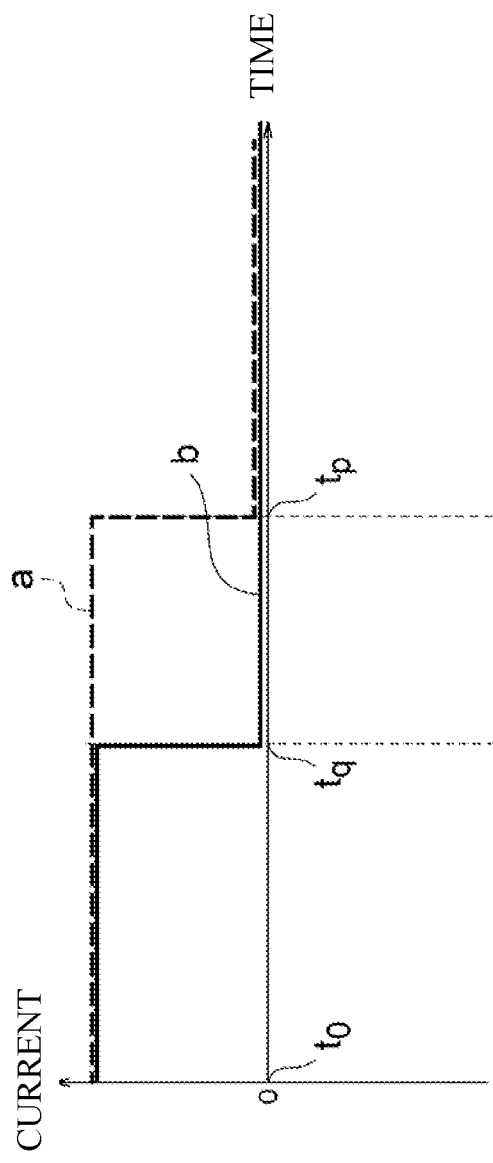
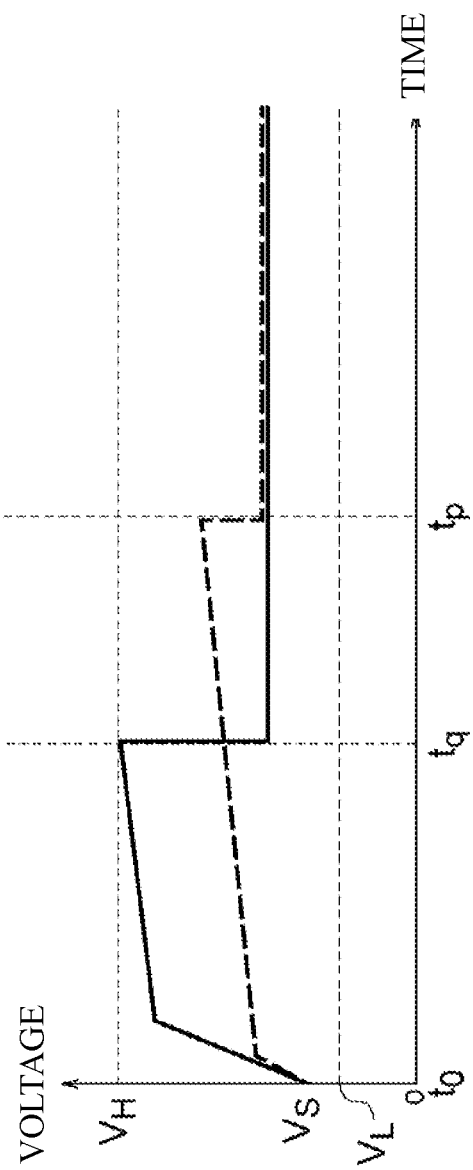
Fig.11A
Fig.11B

CAPACITY MAINTENANCE RATE ESTIMATION APPARATUS OR CAPACITY MAINTENANCE RATE ESTIMATION METHOD

TECHNICAL FIELD

The present invention relates to a capacity ratio estimation method of a battery or a capacity ratio estimation apparatus for a battery.

BACKGROUND

A battery capacity calculation method for calculating battery capacity is known. In the battery capacity calculation method, a current integrated charge-rate change amount is calculated based on an integration value of sensor current for a predetermined current-integration period within a charging period of a battery, open circuit voltage at the start and end of the predetermined current-integration period is estimated based on the state quantity of the battery, charge rates at the start and end of the predetermined current-integration period is calculated based on the estimated open circuit voltage, and an open circuit voltage charge-rate change amount is calculated based on their difference. Then, a capacity ratio, which is a ratio of the current integrated charge-rate change amount to the open circuit voltage charge-rate change amount is calculated and a battery capacity of the battery is calculated by multiplying the capacity ratio to the initial battery capacity of the battery (Japanese Patent Application JP 2011-215125 A).

However, there has been a problem that calculation accuracy of the capacity ratio is low due to detection errors of a sensor.

SUMMARY

An object of the present invention is to provide a capacity ratio estimation apparatus and capacity ratio estimation method that provide high estimation accuracy in the capacity ratio.

To solve the above problem, in the present invention, a period from a first time point to second time point is specified. The first time point and the second time point are a time point when the current of the battery is in the 0 the vicinity of 0 amperes. Then, for the integration period, an integration value of the current of the battery is calculated, a first open circuit voltage at the first time point and a second open circuit voltage at the second time point are calculated based on the detected voltages of the battery, a capacity ratio of the battery is estimated based on a voltage difference between the first open circuit voltage and the second open circuit voltage and the integration value satisfying the predetermined condition, and predetermining conditions are set so that the integration value becomes equal to a lower limit value or greater and an average value of the current of the battery for the integration period becomes equal to a predetermined value or more.

According to the present invention, since the capacity ratio is calculated using an integrated current that has small influence on detection errors of a sensor, an effect of a raise in estimation accuracy of the capacity ratio can be obtained.

BRIEF DESCRIPTION OF THE DRAWINGS

FIG. 7A is a graph illustrating current changes and FIG. 7B is a graph illustrating voltage changes;

FIG. 10A is a graph illustrating current changes, and FIG. 10B is a graph illustrating SOC changes;

FIGS. 11A and 11B are graphs illustrating state changes (during charge) of the battery in FIG. 1, FIG. 11A is a graph illustrating current changes, and FIG. 11B is a graph illustrating voltage changes;

FIG. 12A is a graph illustrating current changes, and FIG. 12B is a graph illustrating SOC changes;

DETAILED DESCRIPTION

In the following, embodiments of the present invention will be described with reference to drawings.

First Embodiment

Figure 1:
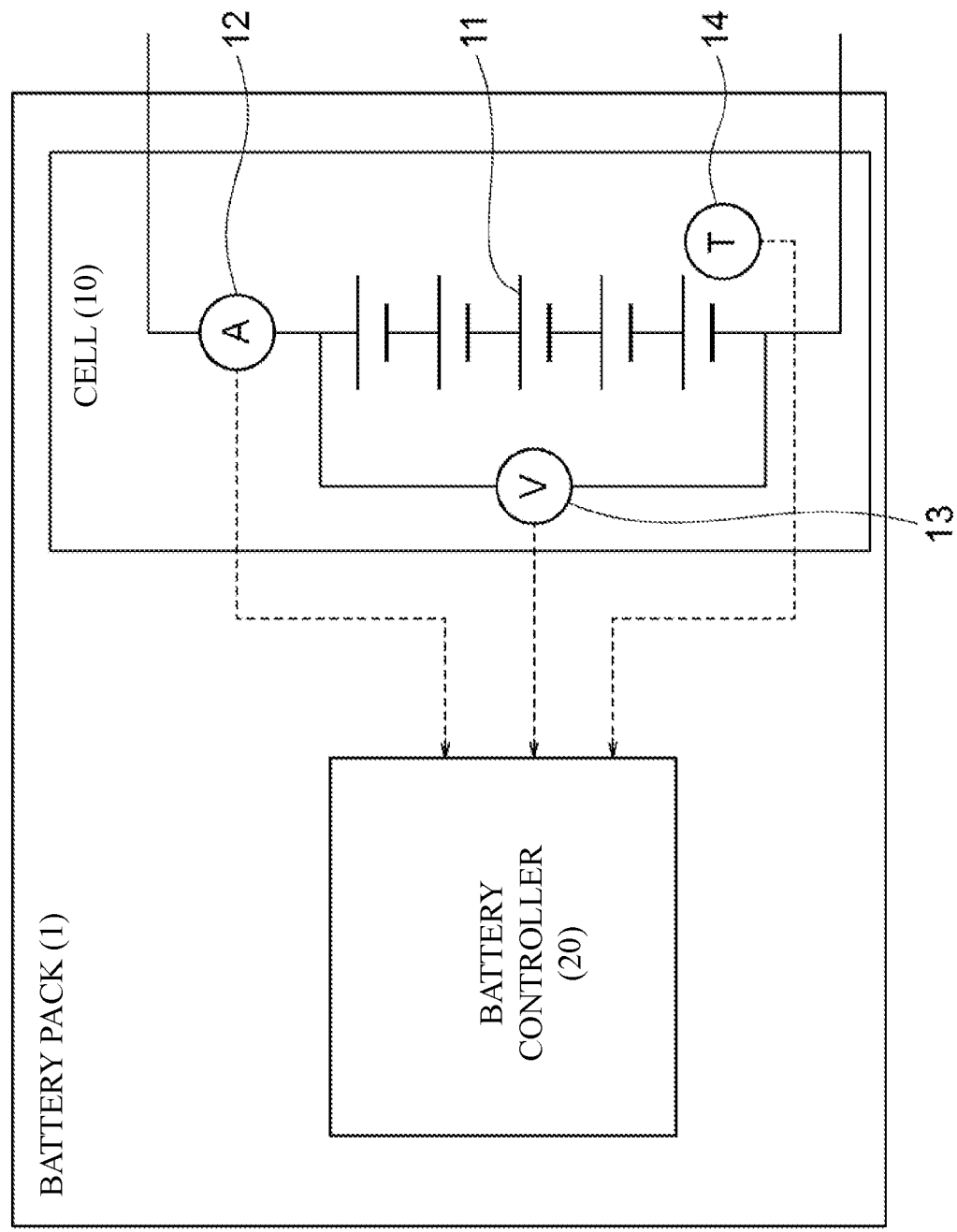
FIG. 1 is a block diagram of a battery pack including a capacity ratio estimation apparatus according to the present embodiment.

FIG. 1 is a block diagram of a battery pack provided with a capacity ratio estimation apparatus according to the present embodiment. The capacity ratio estimation apparatus is an apparatus for estimating capacity ratio (corresponds to deterioration level) of the battery. In the present embodiment, the capacity ratio estimation apparatus is installed within the battery pack. The capacity ratio estimation apparatus is not necessarily installed inside the battery pack and may be installed outside the battery pack.

The battery pack 1 includes a cell 10 and a battery controller 20. The battery pack 1 is a modularized device of a secondary battery and controller. The battery pack 1 is used for a power supply of a vehicle and stationary power supply, etc.

The cell 10 includes a battery 11, current sensor 12, voltage sensor 13, and temperature sensor 14. The battery 11 is a battery pack connecting a plurality of secondary batteries in series and/or in parallel. The battery 11 outputs power to a load connected to the battery pack 1. The battery 11 is chargeable with a charger connected to the battery pack 1. The battery 11 may be charged by regeneration of the load. The secondary battery is a lithium ion battery or the like.

The current sensor 12 detects charge current and discharge current of the battery 11. The voltage sensor 13 detects voltage of the battery 11. The temperature sensor 14 is installed near the battery 11 and detects temperature of the battery 11. Detected values of the current sensor 12, voltage sensor 13, and temperature sensor 14 are output to the battery controller 20.

The battery controller 20 manages a state of the battery 11 based on the detected values by the current sensor 12, voltage sensor 13, and temperature sensor 14.

Figure 2:
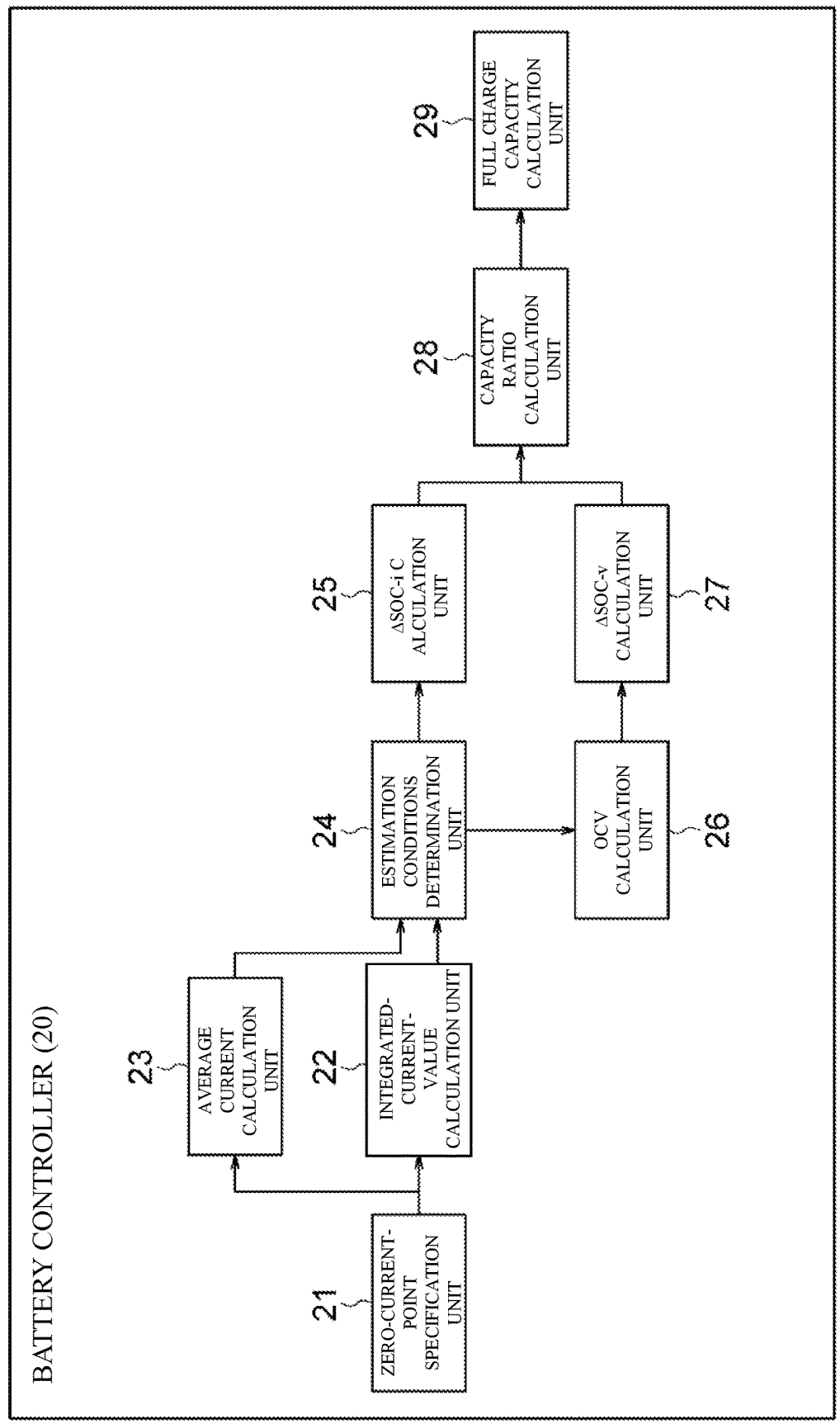
FIG. 2 is a block diagram of a battery controller in FIG. 1.

Next, with reference to t FIG. 2, structure of the battery controller 20 will be described. FIG. 2 is a block diagram of the battery controller 20. The battery controller 20 includes a CPU, ROM, and RAM, etc. The battery controller 20 includes a zero-current-point specification unit 21, integrated-current-value calculation unit 22, average current calculation unit 23, estimation-conditions determination unit 24, ΔSOC-i calculation unit 25, OCV calculation unit 26, ΔSOC-v calculation unit 27, capacity ratio calculation unit 28, and full-charge capacity calculation unit 29 as a functional block for operating functions to manage the state of the battery 11.

The zero-current-point specification unit 21 specifies a time point when an absolute value of the battery current is in the vicinity of 0 amperes as a zero-current point based on the current detected by the current sensor 12. The range around 0 amperes is a range between zero or more and less than a predetermined value. The predetermined value is a value which enables determination that the charge-discharge current of the battery 11 is zero, in other words, a value which enables determination to determine that no load is applied to the battery 11 (not being charged or discharged). The predetermined value is set in advance in accordance with errors of the current sensor 12 or characteristics of the battery 11, etc. The discharge current or charge current of the battery 11 changes over time in accordance with how the battery 11 is used. Accordingly, the zero-current points are specified chronologically.

The integrated-current-value calculation unit 22 specifies an integration time which indicates the time period between a plurality of zero-current points and calculates an integration value of the battery current for the integration period by adding up the current detected by the current sensor 12.

The average current calculation unit 23 calculates average current of the battery 11 for the integration period based on the current detected by the current sensor 12.

The estimation-conditions determination unit 24 determines that whether or not the integrated current value of the integration period satisfies estimation conditions. The estimation conditions are the conditions for indicating that the integrated current value is the value suitable for estimation of the capacity ratio. The estimation conditions include that the integrated current value of the integration period is equal to a predetermined lower limit value or greater, and that the average current of the integration period is equal to an average current-threshold value or greater. The lower limit value and average current-threshold value of the integrated current value are set in advance according to a range of errors of the current sensor 12. The integrated current value not satisfying the estimation conditions is excluded from the calculation target since the value is not suitable for estimating a capacity ratio.

The ΔSOC-i calculation unit 25 calculates a difference between SOCs that correspond to the integrated current values satisfying the estimation conditions. In other words, the ΔSOC-i calculation unit 25, divides a current integration amount (Ah) from the start point to the end point of the integration period by full-charge capacity (Ah) when the battery is new to calculate a change amount of the SOC between the start point and the end point of the integration period. The OCV calculation unit 26 calculates open circuit voltage at the zero-current point based on the voltage detected by the voltage sensor 13. The start point and the end point of the integration period become the zero-current points. For this reason, the OCV calculation unit 26 can calculate the open circuit voltage for each of the start point and the end point of the integration period while suppressing influence of the internal resistance of the battery 11 that changes by temperature and a degree of deterioration to the utmost. Further, in the following, the open circuit voltage is also called as OCV (Open Circuit Voltage).

The ΔSOC-v calculation unit 27 calculates a voltage difference between the open circuit voltage at the start point of the integration period and the open circuit voltage at the end point of the integration period. The ΔSOC-v calculation unit 27 calculates an SOC difference that corresponds to the calculated voltage difference. In other words, the ΔSOC-v calculation unit 27 calculates a change amount of SOC between the start point and the end point of the integration period based on the difference between the open circuit voltage at the start point of the integration period and the open circuit voltage at the end point of the open circuit voltage.

The capacity ratio calculation unit 28 calculates a present capacity ratio of the battery 11 based on the SOC difference (ΔSOC-i) calculated by the ΔSOC-i calculation unit 25 and the SOC difference (ΔSOC-v) calculated by the ΔSOC-v calculation unit 27. The capacity ratio calculation unit 28 divides the SOC difference (ΔSOC-i) calculated by the ΔSOC-i calculation unit 25 by the SOC difference (ΔSOC-v) calculated by the ΔSOC-v calculation unit 27 to calculate the present capacity ratio. In other words, the capacity ratio is estimated from the calculation by the ΔSOC-i calculation unit 25, calculation by the ΔSOC-v calculation unit 27, and calculation by the capacity ratio calculation unit 28. Then, the full-charge capacity calculation unit 29 calculates a present full-charge capacity of the battery 11 based on the present capacity ratio and initial full-charge capacity.

Figure 3:
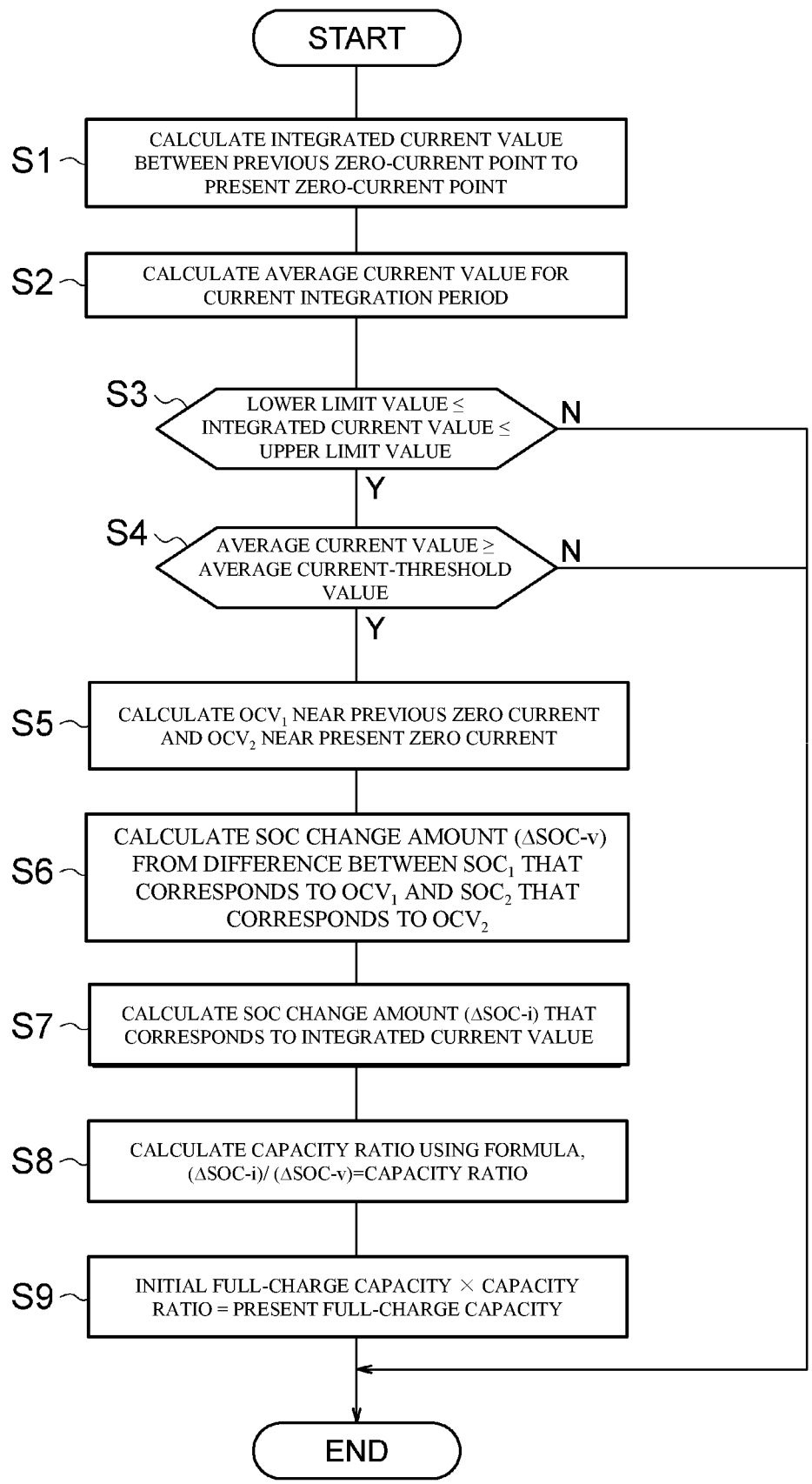
FIG. 3 is a flowchart illustrating a control flow of the battery controller in FIG. 1.

Next, a control flow of the battery controller 20 for calculating the full-charge capacity will be described with reference to FIG. 3. FIG. 3 is a flowchart illustrating a control flow of the battery controller 20. More, the control flow illustrated in FIG. 3 is repeatedly performed at each of timings when the zero-current points are specified.

In step S1, the integrated-current-value calculation unit 22 calculates an integrated current value from the previous zero-current point to the present zero-current point.

In step S2, the average current calculation unit 23 calculates average current between the previous zero-current point and the present zero-current point.

In step S3, the estimation-conditions determination unit 24 determines that whether or not the integrated current value is within a range, that is a range from the lower limit value or more to the upper limit value or lower determined in advance. When the integrated current value is less than the lower limit value, or when the integrated current value is greater than the upper limit value, the control flow ends. When the integrated current value is within the range of the lower limit value or more to the upper limit value or less, the control flow proceeds to step S4.

In step S4, the estimation-conditions determination unit 24 determines whether or not the average current value is equal to the average current-threshold value or greater. When the average current value is less than the average current-threshold value, the control flow ends. When the average current value is equal to the average current-threshold value or more, the control flow proceeds to step S5.

Figure 4:
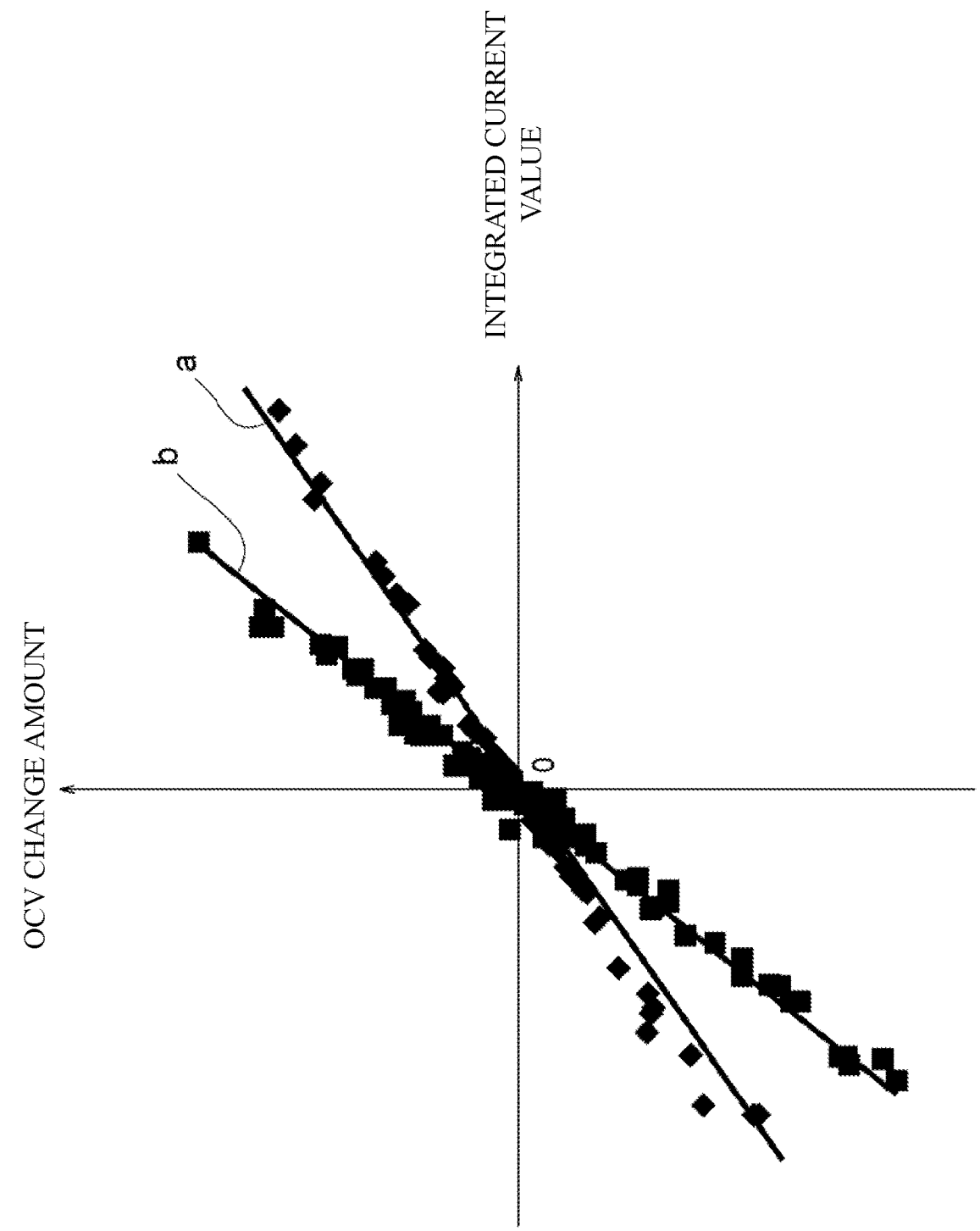
FIG. 4 is a graph illustrating characteristics of change amount of OCV relative to an integrated current value of a battery.

Now, the estimation conditions used for the determining factor of the control flow in steps S3 and S4 will be described. First, among the estimation conditions, the lower limit value for the integrated current value will be described with reference to FIG. 4. FIG. 4 is a graph illustrating a relationship between the integrated current value and the change amount of the open circuit voltage. The graph a illustrates characteristics of the battery 11 when it is new. The graph b illustrates the characteristics of the battery 11 when its full-charge capacity becomes a half. By measuring each of the integrated current values and the change amount of the OCV that corresponds to the integrated current value, the measurement values can be plotted with dots as illustrated in FIG. 4. The integrated current value and the change amount of OCV are proportional. However, as deterioration of the battery proceeds, the change amount of OCV relative to the integrated current value becomes greater along with decrease in the full-charge capacity, and thus inclination of the graph becomes greater.

Here, the integrated current value corresponds to the change amount of the remaining charge quantity of the battery 11. On the other hand, the OCV is correlated with SOC (State of Charge: a ratio of the remaining charge quantity relative to the charge quantity at the time of full charge), and thus the change amount of the OCV corresponds to the change amount of the SOC of the battery 11. Accordingly, the integrated current value that corresponds to the change amount of the remaining charge quantity and the change amount of OCV that corresponds to the SOC are correlated. However, even when the integrated current values, or the change amounts of the remaining charge quantity, are the same, the change amount of the OCV that corresponds to the change amount of the SOC increases along with decrease in the charge quantity (full-charge capacity) at the time of full charge due to deterioration of the battery. As can be seen from the above, the OCV and SOC are correlated and since the SOC can be unambiguously determined from the OCV, substantially, the OCV and SOC mean the same thing.

From the graph in FIG. 4, when the integrated current value is small, the change amount of OCV is small. Further, when the integrated current value is small, the influence of errors of the current sensor 12 increases relative to the change amount in the OCV for the amount the change amount of OCV is small. Accordingly, when the integrated current value is small, it is difficult to determine whether the change reason of OCV is due to a change in charge-discharge of the battery 11 or a change by the errors of the current sensor. For this reason, in the present embodiment, a lower limit value is set for the integrated current value as an estimation condition.

Figure 5:
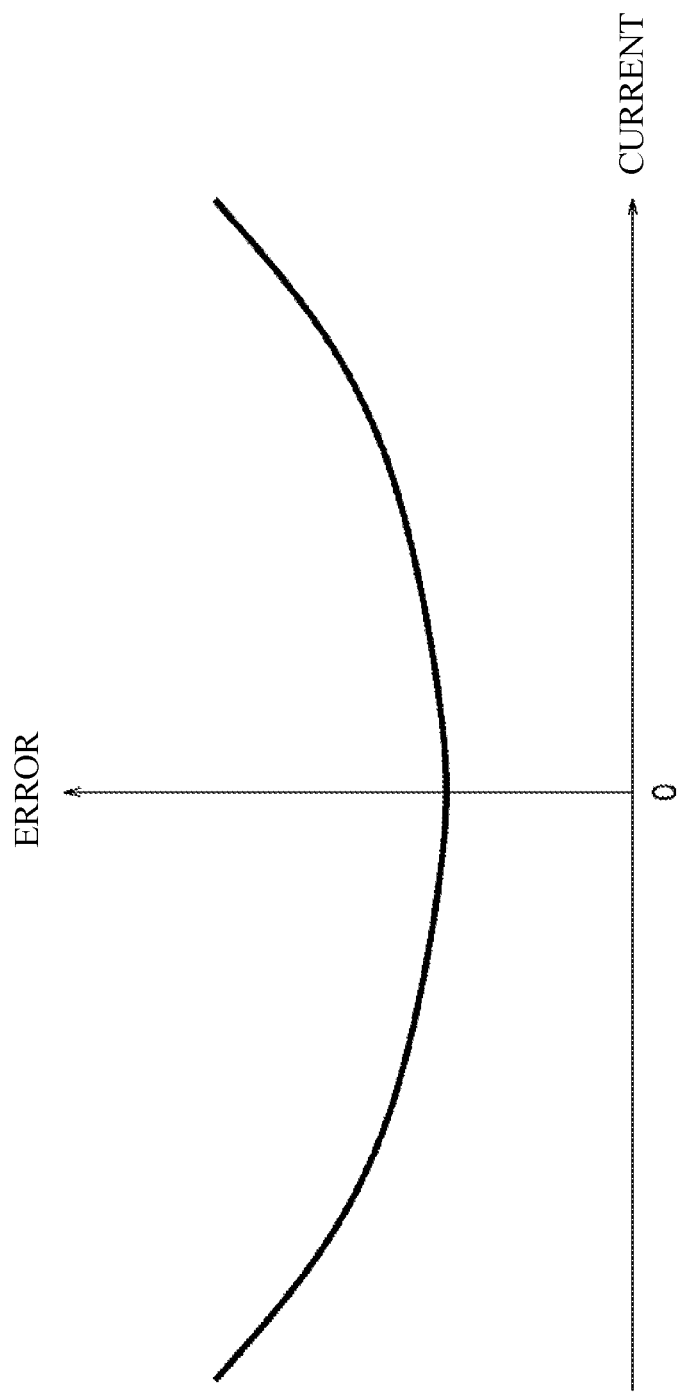
FIG. 5 is a graph illustrating change of errors relative to detected current of the current sensor in FIG. 1.

Next, among the estimation conditions, the upper limit value for the integrated current value will be described with reference to FIG. 5. FIG. 5 is a graph illustrating relationships between the detection values and errors of the current sensor.

As shown in FIG. 5, error characteristics of the current sensor 12 become a quadratic curve where the error when the current is zero is the minimum value. In other words, as an absolute value of a current value increases, the error becomes larger. When the integrated current value increases, errors of the current sensor accumulate and an influence of the errors to the integrated current value increases. Accordingly, in the present embodiment, an upper limit value for the integrated current value is set as an estimation condition. As mentioned above, when the integrated current value is smaller than the lower limit value, influence of the errors of the current sensor 12 on the change amount of OCV becomes greater. Whereas, when the current value is large and when the integrated current value is greater than the upper limit value, influence of the errors relative to the integrated current value due to the errors of the current sensor becomes greater. For this reason, for the upper limit value and lower limit value of the integrated current value, the values are specified in advance such as by experiment so that influence of the errors of the current sensor can be suppressed.

Among the estimation conditions, an average current-threshold value will be described with reference to FIG. 5. In an arithmetic formula of the capacity ratio for the battery 11, the SOC difference (ΔSOC-v) based on the open circuit voltage is set as a numerator, and the SOC difference (ΔSOC-i) based on the integrated current value is set as a denominator. From the characteristics illustrated in FIG. 5, errors of the detected current values become small when the current (charge-discharge current) of the battery 11 is small. In the arithmetic formula for the capacity ratio, error components of the detected current values affect the denominator. For this reason, as the errors of the detected current values become small, their influence on the calculated values of the capacity ratio becomes small. Accordingly, in the present embodiment, an average current-threshold value is set as an estimation condition.

Figure 6:
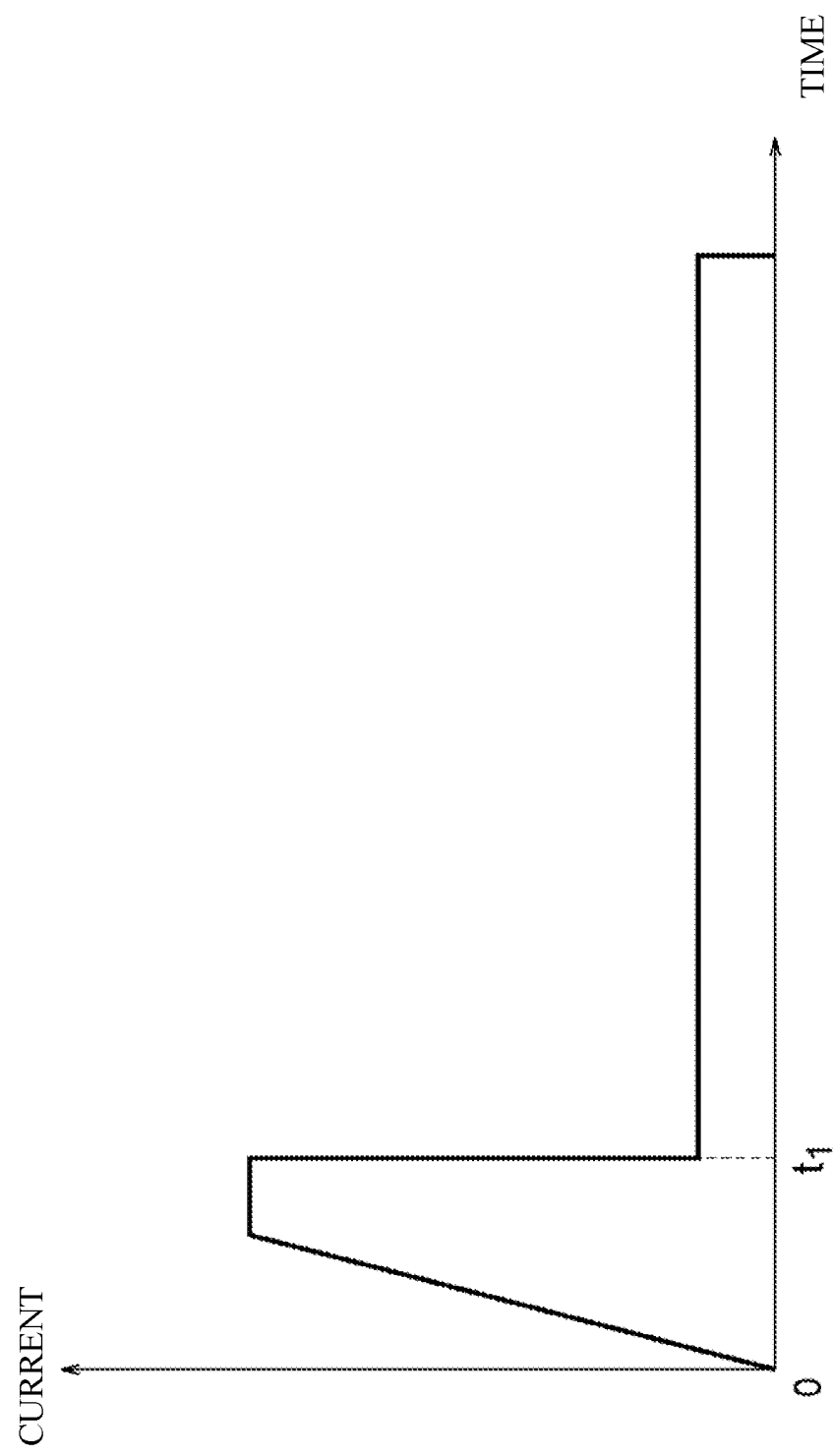
FIG. 6 is a graph illustrating changes over time in the current of the battery in FIG. 1.

Further, as another reason for setting the average current-threshold value, the following reasons can be mentioned. As one example, suppose that a chronological change in the current is the change as shown in FIG. 6. FIG. 6 is a graph illustrating chronological change of the current. In such current change as shown in FIG. 6, the integrated current value falls within a range of lower limit value or more to the upper limit value or lower.

In the current change as shown in FIG. 6, the period of high current up to time $t_1$ is short and the period of low current following the time $t_1$ is long. On and after the time $t_1$, current values are low and thus errors of the current sensor 12 are small. However, because the low-current period on and after the time $t_1$ is long, small current errors accumulate slowly in a long time, and thus errors as a whole included in the integrated current value become large. Accordingly, in the present embodiment, an average current-threshold value is set as an estimation condition. In a current change as shown in FIG. 6, estimation conditions is not satisfied since the average current becomes smaller than the average current-threshold value.

In the control flow between step S3 and step S4, when the estimation conditions are satisfied, the OCV calculation unit 26 calculates an open circuit voltage ($OCV_1$) at the previous zero-current point and the open circuit voltage ($OCV_2$) at the present zero-current point.

Figure 7:
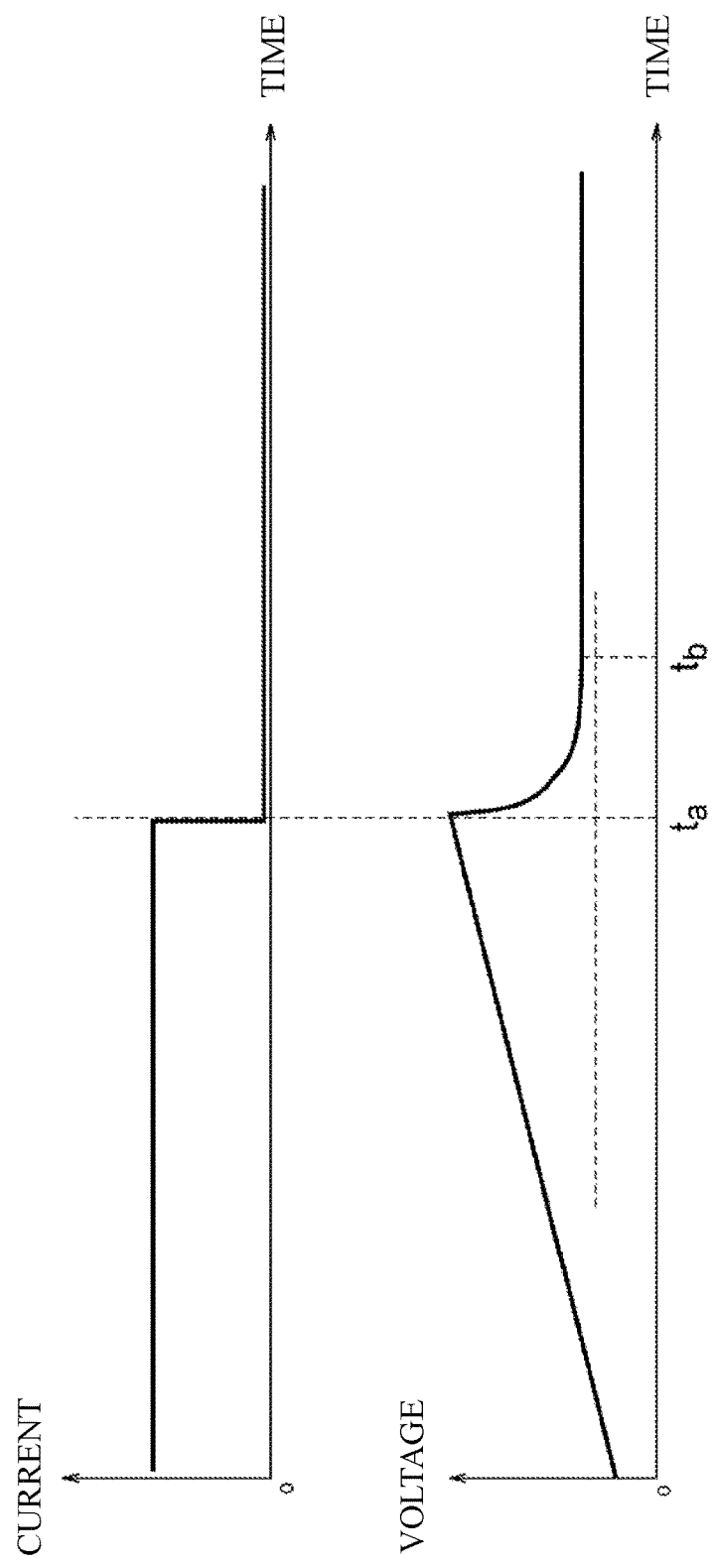
FIGS. 7A and 7B are graphs illustrating current changes due to polarization of the battery in FIG. 1.

Detection timings for the detecting voltage for use in calculation of the open circuit voltage will be described with reference to FIGS. 7A and 7B. FIGS. 7A and 7B are graphs illustrating current change in the battery 11 (current change illustrated in FIG. 7A) and voltage change (voltage change illustrated in FIG. 7B) before and after the zero-current point ($t_a$).

As shown in FIGS. 7A and 7B, the charge current of the battery 11 becomes zero at time $t_a$. The voltage of the battery 11 starts lowering at time $t_a$, however, due to polarization phenomenon, its voltage does not lower completely at time $t_a$. The voltage of the battery 11 gradually lowers on and after time $t_a$. Then, at time $t_b$, polarization is nearly solved and voltage of the battery 11 becomes the completely lowered voltage. In other words, the period between the time $t_a$ and time $t_b$ is the polarization period and battery voltage becomes an unstable state. More, when the open circuit voltage is calculated based on the detected voltage during the polarization period, it may lead to calculation errors. For this reason, the OCV calculation unit 26 calculates the open circuit voltage based on the detected voltage after elapse of a predetermined polarization period from the zero-current point. The polarization period is set in advance according to the characteristics of the battery 11. Also, the OCV calculation unit 26 may set the length of the polarization time according to the size of the voltage of the battery. In this way, calculation accuracy for the open circuit voltage can be raised since the open circuit voltage is calculated based on the voltage where polarization is solved.

After calculating the open circuit voltages ($OCV_1$ and $OCV_2$) in step S5 of the control flow, in step S6, the ΔSOC-v calculation unit 27 calculates a charge state (SOC: State of Charge) that corresponds to the open circuit voltage ($OCV_2$) at this time. There is a correlation between the open circuit voltage and the SOC. The ΔSOC-v calculation unit 27 stores the correlation as a map in advance and calculates the SOC by referencing the map. More, the ΔSOC-v calculation unit 27 calculates a change amount of the SOC (ΔSOC-v) by calculating a difference between $SOC_2$ that corresponds to the open circuit voltage ($OCV_2$) at this time and $SOC_1$ that corresponds to the previous open circuit voltage ($OCV_1$).

In step S7, the ΔSOC-i calculation unit 25 calculates an SOC change amount (ΔSOC-i) using an arithmetic formula representing a ratio of the integrated current value to the present full-charge capacity of the battery 11. In step S8, the capacity ratio calculation unit 28 calculates a capacity ratio using an arithmetic formula representing a ratio of the SOC change amount (ΔSOC-v) to the SOC change amount (ΔSOC-i). In step S9, the full-charge capacity calculation unit 29 calculates a present full-charge capacity by multiplying the present capacity ratio to the initial full-charge capacity.

As shown above, in the present embodiment, a period from the first time point when an absolute value of the battery current is in the vicinity of 0 amperes to the second time point when the absolute value of the battery current is in the vicinity of 0 amperes is specified as the integration period, an integration value of the battery current for the integration period is calculated, the first open circuit voltage at the first time point and the second open circuit voltage at the second time point are calculated based on the detected voltage of the battery, and a capacity ratio of the battery is estimated based on the voltage difference between the first open circuit voltage and the second open circuit voltage and the integration value satisfying the estimation conditions. When doing this, for the estimation conditions, that the integration value is equal to the predetermined lower limit value or more and that the average value of the current of the battery for the integration period is equal to the predetermined value or more are set. In this way, estimation accuracy for the capacity ratio can be improved since the capacity ratio is calculated using an integrated current value that has small influence on the detection errors of the sensor.

Figure 8:
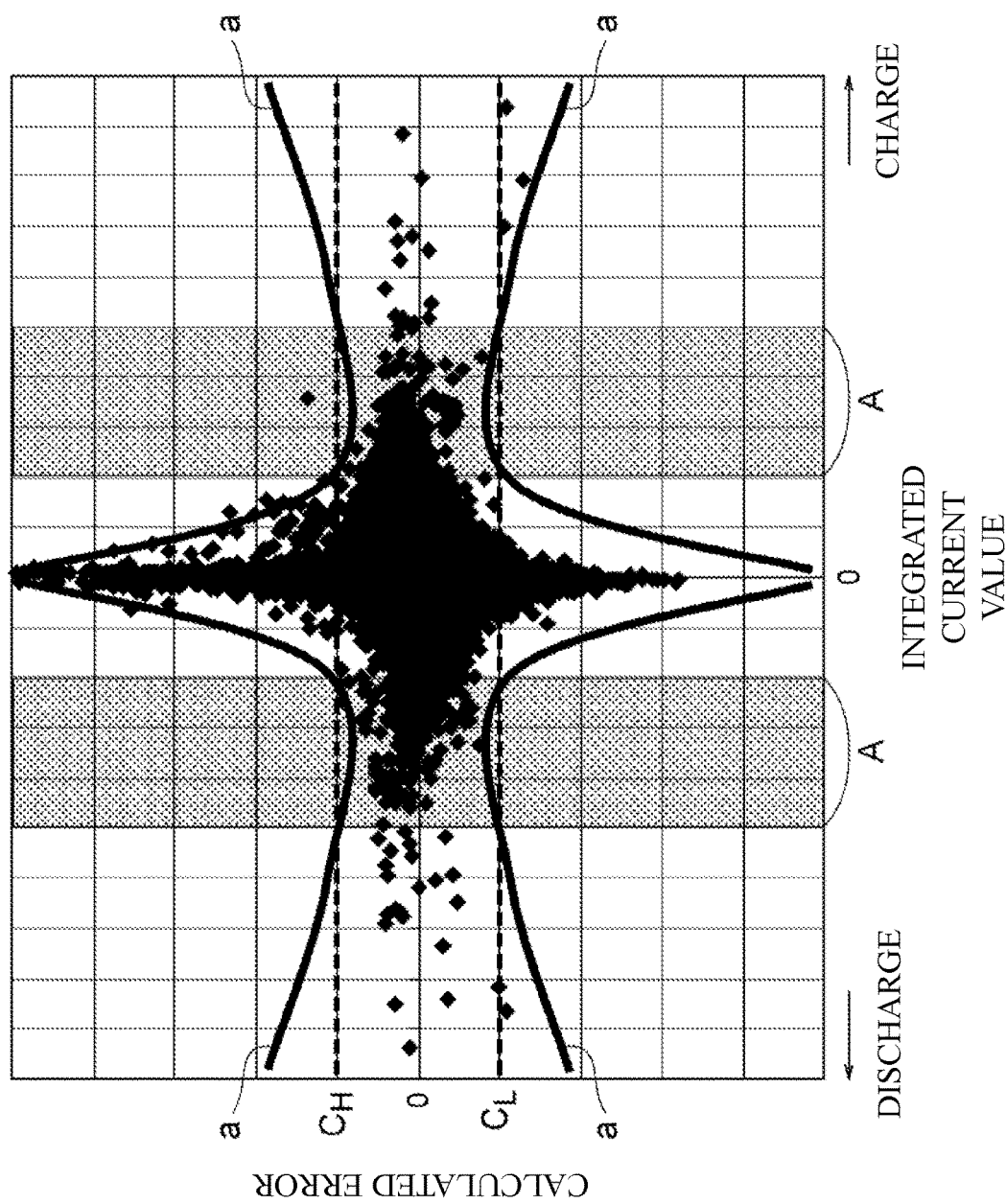
FIG. 8 is a graph illustrating a relationship between the integrated current value of the battery in FIG. 1 and calculation errors in the capacity ratio.

Now, the relationships between the integrated current value and calculation errors of the capacity ratio will be described with reference to FIG. 8. FIG. 8 is a graph illustrating the relationships between the integrated current value and calculation errors. In FIG. 8, a rhombic shape is made by plotting measured values of the calculation errors with respect to the integrated current value. Calculation of the capacity ratio is performed using the calculation method (hereafter, also called as ΔSOC calculation method) performed in the control flow shown in FIG. 3.

The integrated current value is not limited to the above estimation conditions, but set in a wider range while setting at least higher than zero. Also, calculation errors correspond to a difference between the calculated value calculated using the SOC calculation method and the actual capacity ratio. Additionally, the lower limit value of the tolerable calculation errors is set as $C_L$ and the upper limit value of the tolerable calculation errors is set as $C_H$.

As shown in FIG. 8, the calculation error becomes the maximum when the integrated current value becomes close to zero. Further, as the absolute value of the integrated current value becomes greater, calculation error becomes smaller. Furthermore, when the absolute value of the integrated current value becomes greater, calculation error becomes greater again with a border at a predetermined region. When an approximation curve is drawn for the plotted measured values, a graph as shown in graph a is obtained. Then, a range A indicated by intersection points of approximation curve a and the upper limit value $C_H$ of the calculation errors becomes the range where calculation errors become small relative to the integrated current value. The range A is the same range as the range indicated between the intersection points of the approximation curve a and lower limit value $C_L$ of the calculation errors.

In the present embodiment, the upper limit value and the lower limit value of the integrated current value that correspond to the range A are set as the upper limit value and lower limit value of the integrated current values in the estimation conditions. As shown in FIG. 8, the integrated current value that satisfies the estimation conditions is included within the range A and thus calculation errors become smaller than the errors outside the range A when compared. In such a way, estimation accuracy for the capacity ratio can be improved by using the integrated current value that satisfies the estimation conditions as the calculation target.

Also, in the present embodiment, the period between the zero-current points is set as the period for the calculation target of the capacity ratio. In this way, estimation accuracy for the open circuit voltage (non-load voltage) can be raised and thus calculation accuracy for the full-charge capacity can be improved.

Next, relationships between the calculation method and SOC errors will be described with reference to FIG. 9. As a method for calculating an SOC, a method of calculating an SOC from the integrated current voltage and open circuit voltage can be considered. In other words, the method calculates the SOC by adding (performing weighting composition) the SOC (hereafter, called as SOC-v) determined from the open circuit voltage and the SOC (hereafter, called as SOC-i) determined from the integrated current value at a predetermined ratio, and in the following, this method is also called as a blending method. In the SOC calculation method of the blending method, when the current value is relatively small, a ratio of SOC-v is set to a greater ratio and a ratio of SOC-i is set to a smaller ratio. When the current value is relatively large, the ratio of SOC-i is set to a larger ratio and a ratio of SOC-v is set to a smaller ratio. Then, by adding the ratio of SOC-i and SOC-v that are set, SOC is calculated. Further, such SOC calculation method of the blending method, is well-known to the public as disclosed in JP 2013-217899A (Japanese Unexamined Patent Application Publication No. 2013-217899), etc., for example, and thus not described in detail in the following. Additionally, although in the present embodiment the blending method where the SOC-v and SOC-i are added at a predetermined ratio is used as the SOC calculation method, the SOC calculation method is not limited to the blending method. For example, an SOC calculation method where either SOC-v or SOC-i is adopted as the SOC according to the current value may be used.

Figure 9:
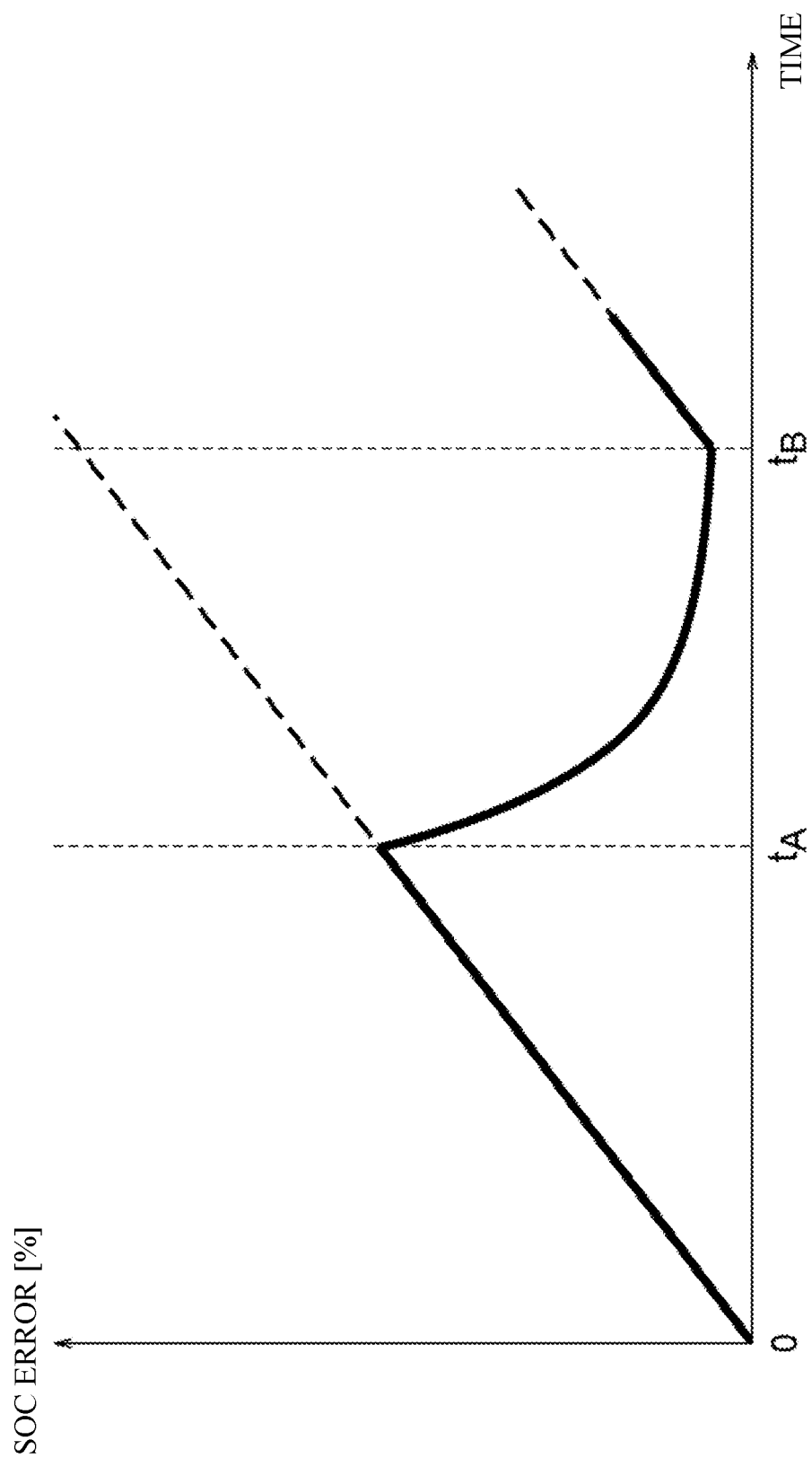
FIG. 9 is a graph illustrating error changes in an SOC calculation value of the battery in FIG. 1.

FIG. 9 illustrates SOC errors when SOCs are calculated in the blending method. More, the period from time $t_A$ to time $t_B$ is the period where the current becomes small, and the period from time 0 to time $t_A$ and the period on and after time $t_B$ is the period where the current becomes large. The zero-current point is supposed to be within the period between time $t_A$ and time $t_B$.

In the SOC calculation method of the blending method, a composition ratio of SOC-i is large as the current value is large in the periods between time 0 to time $t_A$ and period on and after $t_B$, and composition ratio of SOC-v is small. On the other hand, the composition ratio of SOC-v is large in the period between time $t_A$ to time $t_B$ and the composition ratio of SOC-i is small. The composition ratio corresponds to a percentage relative to a total ratio obtained by summing up the ratio of SOC-i and ratio of SOC-v.

Using time 0 as the origin, errors of the current sensor 12 accumulates along with elapse of time since the composition ratio of SOC-i based on the integrated current value is high. When the composition ratio of SOC-i based on the integrated current value is kept high on and after $t_A$, errors of the current sensor 12 accumulates even when the current lowers and thus current errors further accumulates. On the other hand, when the current value is small, by using the blending method where the composition ratio of SOC-v becomes large, the composition ratio of SOC-v determined using an open circuit voltage calculated based on the voltage at the zero-current point increases, and thus calculation of SOC based on the open circuit voltage at the zero-current point is considered to correct the SOC errors based on the integrated current value. In other words, in the blending method, it can be said that the estimated errors of the SOC based on the integrated current value are corrected by estimation of the SOCs based on the open circuit voltage at the time of zero-current point. As a result, calculation accuracy for the full-charge capacity can be improved.

Additionally, in the present embodiment, a range where the integration value is equal to a predetermined lower limit value or more to the upper limit value or below is set as an estimation condition. In this way, estimation accuracy for the capacity ratio can be improved as the capacity ratio is calculated using the integrated current value with smaller influence on the detected errors of the sensor.

Figure 10A:
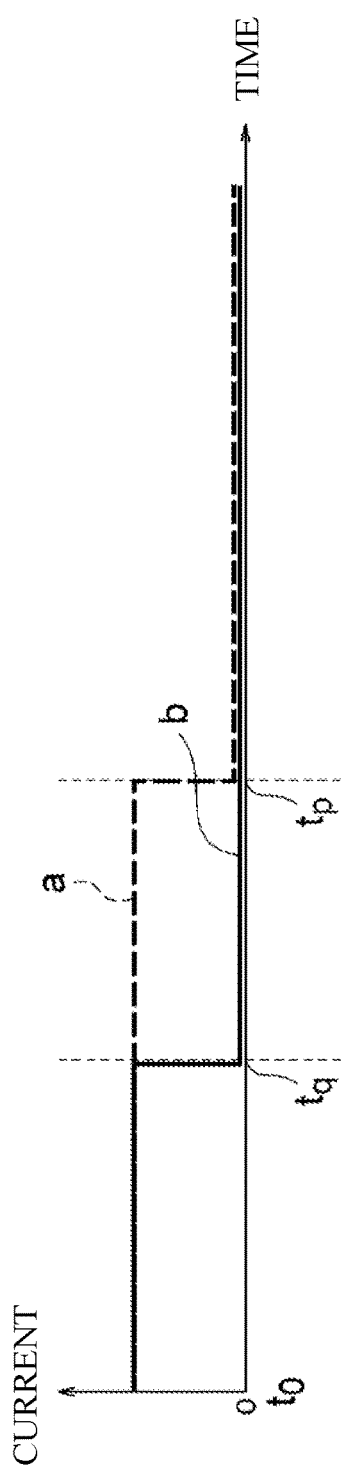
FIGS. 10A and 10B are graphs illustrating state changes (during charge) of the battery in FIG. 1.
Figure 10B:
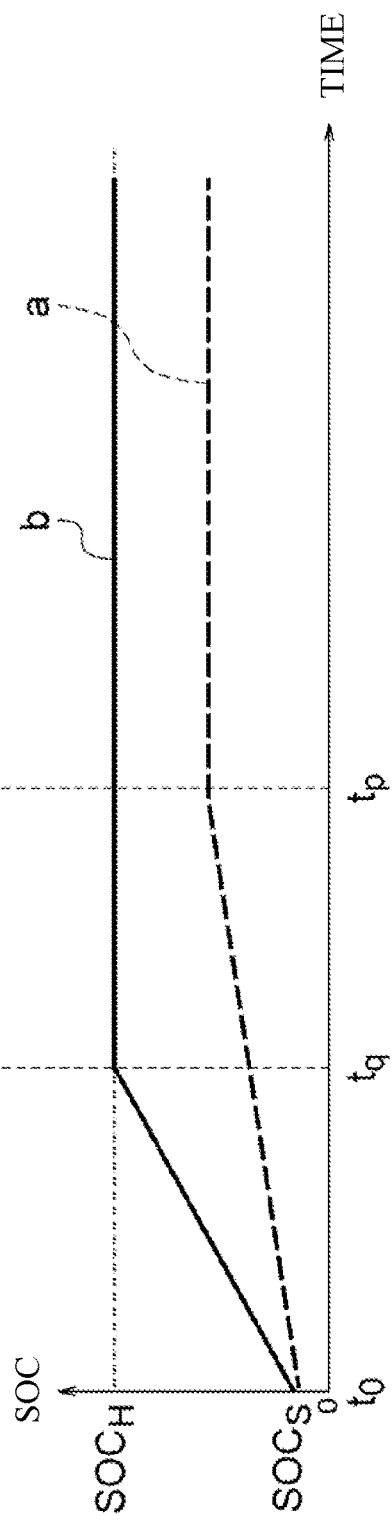

Also, as a modified example of the present embodiment, the estimation-conditions determination unit 24 may set a lower limit value of the integrated current value included in the estimation conditions based on the estimated value of the capacity ratio. FIGS. 10A and 10B are graphs showing one example of current change (the change shown in FIG. 10A) and voltage change (the change shown in FIG. 10B) in the battery 11.

The changes in the current and voltage shown in FIGS. 10A and 10B are the changes when the battery is charged from a certain charged state (SOCs), and graph a shows a current change in the initial state (before deterioration), and graph b shows a current change after deterioration. More, time $t_p$ represents the time at which the integrated current value summed up from time to reaches the lower limit value of the estimation conditions in a battery 11 in the initial state.

When managing the battery 11, in order to protect the battery 11, an upper limit value ($SOC_H$) for the SOC is set in advance. The battery controller 20 manages the battery 11 so as not to allow SOC of the battery 11 to become higher than the upper limit value ($SOC_H$). In the battery 11 in the initial state, when charge is started from $SOC_S$, the integration value of the charge current reaches the lower limit value of the estimation conditions before the SOC reaches the $SOC_H$. For this reason, the integrated current value accumulated from time $t_0$ to time $t_p$ can be used for estimation control of the capacity ratio.

On the other hand, when the battery 11 deteriorates, a full-charge capacity becomes small, and thus when the same value is used for the charge current, the change amount of the SOC after deterioration (corresponds to the inclination of the graph in FIG. 11B) becomes greater than the change amount of the SOC at the initial state (before deterioration). Further, before the integration value of the charge current reaches the lower limit value of the estimation conditions, the SOC reaches the upper limit value ($SOC_H$) at the point of time $t_q$, and the charge current lowers. As a result, frequency for estimating the capacity ratio becomes low.

Like in FIGS. 10A and 10B, the characteristics illustrated in FIGS. 11A and 11B are one example of the current and voltage changes when the battery is charged from a certain voltage ($V_S$), and graph a illustrates characteristics in the initial state (before deterioration) and graph b illustrates characteristics after deterioration. Also, the time $t_p$ represents the time when the integrated current value accumulated from time $t_0$ reaches the lower limit value of the estimation conditions in the battery 11 in the initial state.

When managing the battery 11, in order to protect the battery 11, an upper limit value ($V_H$) and the lower limit value ($V_L$) for the voltage are set in advance. The battery controller 20 manages the battery 11 so as not to allow voltage of the battery 11 to become higher than the upper limit value ($V_H$). In the battery 11 in the initial state, when charge is started from $V_S$, the integration value of the charge current reaches the lower limit value of the estimation conditions before the battery voltage reaches $V_H$. For this reason, the integrated current value accumulated from time $t_0$ to time $t_p$ can be used for the estimation control of the capacity ratio.

When the battery 11 deteriorates, its full-charge capacity becomes small and internal resistance of the battery 11 becomes large. According to relational expression (V=E+IR) of the battery 11 including battery voltage (V), open circuit voltage (E), battery current (I), and internal resistance (R), when the internal resistance increases change in the voltage (IR) generated by the current and internal resistance increases and when the full-charge capacity becomes small, voltage change along with the change in remaining charge quantity, or change in the open circuit voltage (E) increases. In other words, when the battery 11 deteriorates, the battery voltage tends to change more easily compared to the battery before deterioration and thus it becomes easy for the upper limit value to reach the lower limit value. As illustrated in FIG. 11B, before the integration value of the charge current reaches the lower limit value of the estimation conditions, at the point of time $t_q$, the battery voltage reaches the upper limit value ($V_H$) and the charge current becomes low. Accordingly, frequency for estimation of the capacity ratio becomes low.

Figures 12A, 12B:
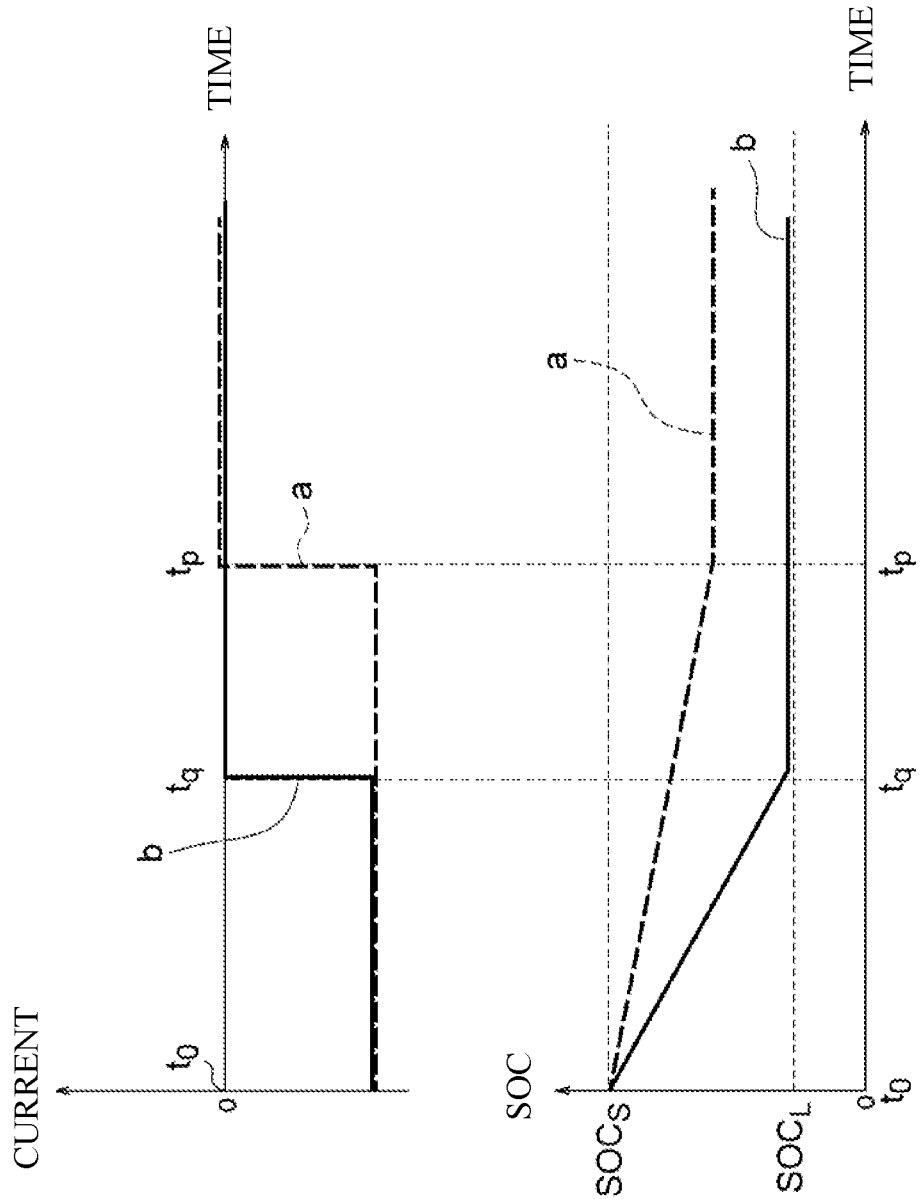
FIGS. 12A and 12B are graphs illustrating state changes (during discharge) of the battery in FIG. 1.

The characteristics shown in FIGS. 12A and 12B are one example of the changes in the current and SOC when the battery is discharged from a charged state ($SOC_S$), graph a illustrates current changes in the initial state (before deterioration) and graph b illustrates SOC changes after deterioration. More, the time $t_p$ represents the time when the integrated current value summed up from time $t_0$ reaches the lower limit value in the estimation conditions.

For management of the battery 11, in order to protect the battery 11, a lower limit value ($SOC_L$) for the SOC is set in advance. The battery controller 20 manages the battery 11 so as not to allow SOC of the battery 11 to become lower than the lower limit value ($SOC_L$). In the battery 11 in the initial state, when discharge is started from $SOC_S$, the integration value of the discharge current reaches the lower limit value of the estimation conditions before the SOC reaches the $SOC_L$. For this reason, the integrated current value accumulated between time $t_0$ to time $t_p$ can be used for estimation control of the capacity ratio.

On the other hand, when the battery 11 deteriorates, a full-charge capacity becomes small, and thus when the same value is used for the discharge current, the change amount of the SOC after deterioration (corresponds to the inclination of the graph in FIG. 11B) becomes greater than the change amount of the SOC in the initial state (before deterioration). Further, before the integration value of the discharge current reaches the lower limit value of the estimation conditions, the SOC reaches the lower limit value ($SOC_L$) at the point of time $t_q$, and the discharge current becomes zero. As a result, frequency for estimating the capacity ratio becomes low.

The estimation-conditions determination unit 24 according to the modified example lowers the lower limit value of the estimation conditions based on the estimated value of the capacity ratio. Specifically, the estimation-conditions determination unit 24 lowers the lower limit value of the estimation conditions as the capacity ratio becomes smaller. Or, the estimation-conditions determination unit 24 lowers the lower limit value of the estimation conditions when the capacity ratio is lower than the predetermined value. In this way, even when the battery 11 deteriorates, calculation frequency for the capacity ratio can be maintained.

Further, the estimation-conditions determination unit 24 according to the modified example sets the lower limit value of the estimation conditions instead of the estimated value of the capacity ratio based on the internal resistance of the battery 11 or the length of time the battery 11 is used. Specifically, as the length of time the battery is used increases, a smaller value is set for the lower limit value for the estimation conditions. Or, the estimation-conditions determination unit 24 makes the lower limit value of the estimation conditions smaller than the predetermined value when the internal resistance is higher than the predetermined value or when the length of time the battery is used is longer than the predetermined period of time.

Furthermore, as a modified example of the present embodiment, the estimation-conditions determination unit 24 adds to the estimation conditions that the integration current value should be within the range of the lower limit value or more to the upper limit value or less, that the average current value should be less than the average current-threshold value, and that the detected voltage by the temperature sensor 14 should be equal to the predetermined temperature threshold value or more.

Figure 13:
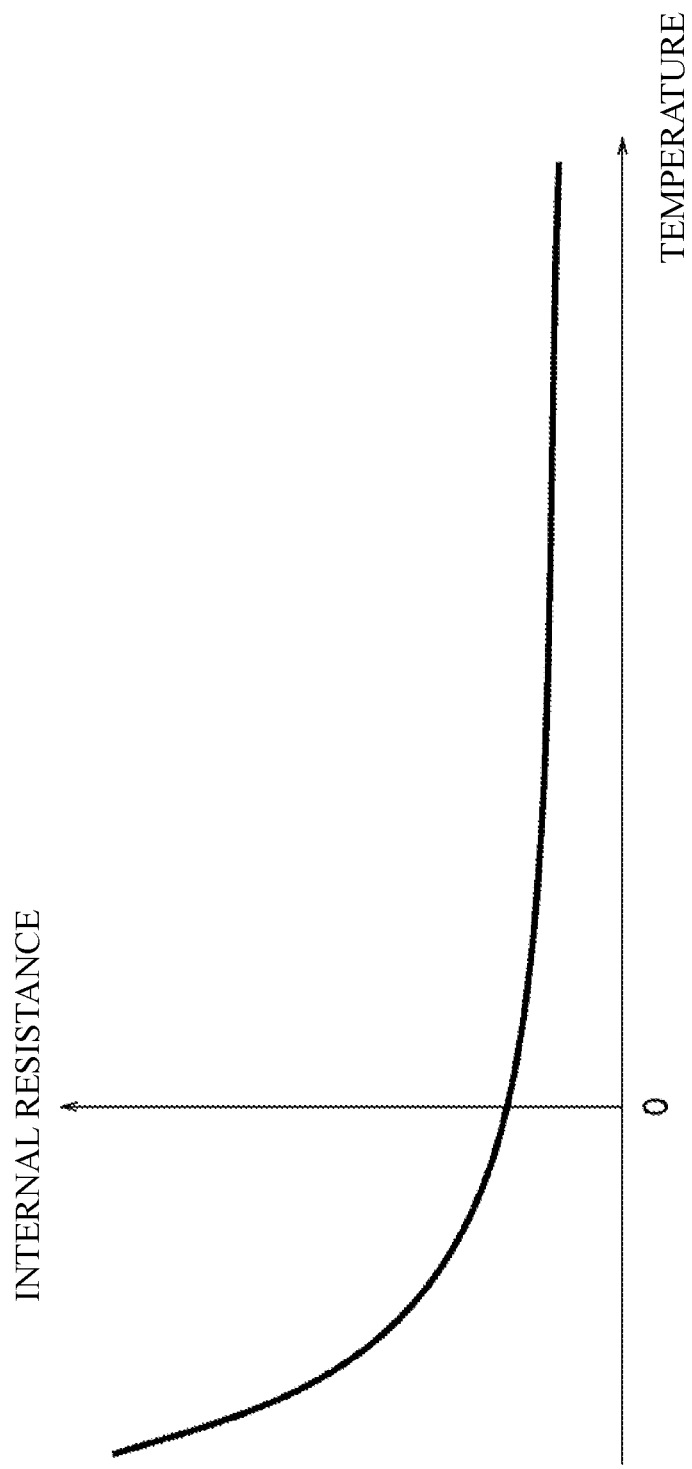
FIG. 13 is a graph illustrating changes in internal resistance relative to temperature of the battery in FIG. 1.

FIG. 13 is a graph illustrating characteristics of the internal resistance relative to the temperature of the battery 11. As shown in FIG. 13, as a characteristic of battery 11, the internal resistance of the battery 11 changes by a constant value when the temperature of the battery 11 is the predetermined value or more. On the other hand, when the temperature of the battery 11 is lower than the predetermined value, the internal resistance increases as the temperature of the battery 11 decreases. Further, by an increase in the internal resistance in the low-temperature region, errors of the temperature sensor 14 become larger.

When the OCV calculation unit 26 calculates an open circuit voltage, since the internal resistance is included in the arithmetic formula when the linear regression calculation method is used, errors of the open circuit voltage may become larger for the low-temperature region. Incidentally, the linear regression calculation method is a method for determining an open circuit voltage (E) by an arithmetic formula (V=E+I×R) using a detection value (V) of the current sensor, detection value (I) of the voltage sensor, and internal resistance (R) of the battery 11.

Accordingly, in the modified example, the estimation-conditions determination unit 24 adds to the estimation conditions that the detected voltage of the temperature sensor 14 should be the predetermined temperature threshold value or more. In this way, while suppressing influence of errors of the temperature sensor for the low-temperature region, calculation accuracy for the capacity ratio can be raised.

More, as a modified example of the present embodiment, the estimation-conditions determination unit 24 may add to the estimation conditions that the detected current of the current sensor 12 should be the predetermined current threshold value or more for a predetermined period of time in addition to the conditions such as the integrated current value should be within a range of the lower limit value or more to the upper limit value or less and the average current value should be less than the average current-threshold value. As shown in FIG. 6, in the current integration period, when a period of low current continues for a long time, the errors of the current sensor 12 accumulates in the integrated current value and thus calculation accuracy of the capacity ratio becomes low. For this reason, the estimation-conditions determination unit 24 according to the modified example, by adding current value of the battery 11 to the conditions, the integrated current value in the current integration period is excluded from the calculation target when the current integration period includes a low current period (the current period on and after the time $t_1$ in FIG. 6). Consequently, the estimation accuracy for the capacity ratio can be raised.

More, the capacity ratio estimated in the present embodiment corresponds to the capacity ratio calculated by the capacity ratio calculation unit 28 or the full-charge capacity calculated by the full-charge capacity calculation unit 29.

The above current sensor 12 and voltage sensor 13 correspond to a detection unit (detector) according to the present invention, the estimation-conditions determination unit 24, ΔSOC-i calculation unit 25, ΔSOC-v calculation unit 27, capacity ratio calculation unit 28, and full-charge capacity calculation unit 29 correspond to a capacity ratio estimation unit according to the present invention.

DESCRIPTION OF REFERENCE NUMERALS

1 . . . Battery pack
10 . . . Cell
11 . . . Battery
12 . . . Current sensor
13 . . . Voltage sensor
14 . . . Temperature sensor
20 . . . Battery controller
21 . . . Zero-current-point specification unit
22 . . . Integrated-current-value calculation unit
23 . . . Average current calculation unit
24 . . . Estimation-conditions determination unit
25 . . . ΔSOC-i calculation unit 26 ... OCV calculation unit
27 ... ΔSOC-v calculation unit
28 ... Capacity ratio calculation unit
29 ... Full-charge capacity calculation unit

What is claimed is:

1. A capacity ratio estimation apparatus for estimating a capacity ratio of a battery, comprising:
   a detector for detecting current of the battery and voltage of the battery; and
   a controller that:
   specifies an integration period from a first time point to a second time point and calculates an integration value of the current of the battery for the integration period based on detected current of the battery detected by the detector, the first time point and the second time point being a time point when an absolute value of the current of the battery is substantially 0 amperes;
   calculates a first open circuit voltage of the battery at the first time point based on the detected voltage and calculating a second open circuit voltage of the battery at the second time point based on the detected voltage; and
   estimates a capacity ratio of the battery based on a voltage difference between the first open circuit voltage and the second open circuit voltage, and the integration value that satisfies estimation conditions,
   wherein the estimation conditions include that the integration value is within a range indicated between intersection points of an approximation curve and lower limit value of calculation errors, and the approximation curve is represented by the calculation errors of the capacity ratio with respect to the integrated current value.

2. The capacity ratio estimation apparatus according to claim 1, wherein the estimation conditions include that the integration value is within a range of a first lower limit value or greater to a predetermined upper limit value or less.

3. The capacity ratio estimation apparatus according to claim 2, wherein the controller sets the first lower limit value based on internal resistance of the battery or a period of use of the battery.

4. The capacity ratio estimation apparatus according to claim 1, wherein the detector detects a temperature of the battery, and
   the estimation conditions include that the temperature of the battery is a predetermined threshold value or higher.

5. The capacity ratio estimation apparatus according to claim 1, wherein the estimation conditions include that an absolute value of the detected current of the battery is a predetermined current threshold value or greater for a predetermined period of time.

6. The capacity ratio estimation apparatus according to claim 1, wherein the controller calculates the first open circuit voltage based on the detected voltage of the battery after elapse of a predetermined polarization period from the first time point, and calculates the second open circuit voltage based on the detected voltage of the battery after elapse of a predetermined polarization period from the second time point.

7. The capacity ratio estimation apparatus according to claim 1, wherein the controller sets a second predetermined lower limit value based on an estimated value of the capacity ratio.

8. A capacity ratio estimation method for estimating a capacity ratio of a battery, comprising:
   detecting current of the battery and voltage of the battery using a sensor;
   specifying an integration period from a first time point to a second timepoint, the first time point and the second timepoint being a time point when an absolute value of the current of the battery is substantially 0 amperes;
   calculating, based on detected current of the battery detected by the sensor, an integration value of the current of the battery for the integration period;
   calculating, based on detected voltage detected by the sensor, a first open circuit voltage of the battery at the first time point;
   calculating, based on the detected voltage detected by the sensor, second open circuit voltage of the battery at the second time point;
   calculating a voltage difference between the first open circuit voltage and the second open circuit voltage; and
   estimating a capacity ratio of the battery based on the integration value satisfying estimation conditions and the voltage difference,
   wherein the estimation conditions include a first estimation condition that the integration value is within a range indicated between intersection points of an approximation curve and lower limit value of calculation errors, and the approximation curve is represented by the calculation errors of the capacity ratio with respect to the integrated current value.

* * * * *